United States Patent
Wang

(10) Patent No.: US 9,472,777 B2
(45) Date of Patent: Oct. 18, 2016

(54) PACKAGING METHOD AND DISPLAY DEVICE

(71) Applicant: BOE TECHNOLOGY GROUP CO., LTD., Beijing (CN)

(72) Inventor: Dan Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/432,456

(22) PCT Filed: Apr. 3, 2014

(86) PCT No.: PCT/CN2014/074726
§ 371 (c)(1),
(2) Date: Mar. 30, 2015

(87) PCT Pub. No.: WO2015/089955
PCT Pub. Date: Jun. 25, 2015

(65) Prior Publication Data
US 2015/0340647 A1    Nov. 26, 2015

(30) Foreign Application Priority Data
Dec. 16, 2013    (CN) .......................... 2013 1 0689826

(51) Int. Cl.
*H01L 51/52* (2006.01)
*H01L 51/56* (2006.01)

(52) U.S. Cl.
CPC .......... *H01L 51/5246* (2013.01); *H01L 51/52* (2013.01); *H01L 51/56* (2013.01)

(58) Field of Classification Search
CPC ..................... H01L 51/52; H01L 51/5246
See application file for complete search history.

(56) References Cited

U.S. PATENT DOCUMENTS

| 7,871,949 B2 * | 1/2011 | Lee ........................... C03C 8/02 |
| | | 428/410 |
| 2003/0066311 A1 * | 4/2003 | Li ........................... C03C 27/06 |
| | | 65/43 |

(Continued)

FOREIGN PATENT DOCUMENTS

| CN | 1798710 A | 7/2006 |
| CN | 101807672 A | 8/2010 |

(Continued)

OTHER PUBLICATIONS

English machine translation of CN102690045, Chen et al., published Sep. 26, 2012.*

(Continued)

*Primary Examiner* — Peniel M Gumedzoe
(74) *Attorney, Agent, or Firm* — Banner & Witcoff, Ltd.

(57) ABSTRACT

A packaging method and a display device are provided. The packaging method comprise: providing a first substrate and a second substrate having a packaging region, wherein a region surrounding by the packaging region of the second substrate is provided with a device to be packaged; forming a pattern layer of sealant on the packaging region of the first substrate; bonding the first substrate having the sealant with the second substrate having a device to be packaged so that the packaging region of the first substrate is aligned with the packaging region of the second substrate; and sintering the sealant and applying uniformly a compression force to the packaging region when using a laser to radiate the packaging region.

19 Claims, 3 Drawing Sheets

(56) References Cited

U.S. PATENT DOCUMENTS

| | | | | |
|---|---|---|---|---|
| 2009/0295277 | A1* | 12/2009 | Logunov | H01J 9/261 |
| | | | | 313/504 |
| 2012/0147538 | A1* | 6/2012 | Kawanami | C03C 8/04 |
| | | | | 361/679.01 |
| 2012/0319092 | A1* | 12/2012 | Shimomura | B32B 37/06 |
| | | | | 257/40 |

FOREIGN PATENT DOCUMENTS

| | | |
|---|---|---|
| CN | 102690045 A | 9/2012 |
| CN | 103022374 A | 4/2013 |
| CN | 103102075 A | 5/2013 |
| CN | 103383992 A | 11/2013 |
| CN | 103413897 A | 11/2013 |
| CN | 103426903 A | 12/2013 |

OTHER PUBLICATIONS

Nov. 10, 2015—(CN)—Second Office Action Appn 201310689826.9 with English Tran.

Sep. 23, 2014—International Search Report and Written Opinion Appn PCT/CN2014/074726 with Eng Tran.

Jul. 29, 2015—(CN)—First Office Action Appn 201310689826.9 with Eng Tran.

* cited by examiner

PACKAGING METHOD AND DISPLAY DEVICE

The application is a U.S. National Phase Entry of International Application No. PCT/CN2014/074726 filed on Apr. 3, 2014, designating the United States of America and claiming priority to Chinese Patent Application No. 201310689826.9 filed on Dec. 16, 2013. The present application claims priority to and the benefit of the above-identified applications and the above-identified applications are incorporated by reference herein in their entirety.

TECHNICAL FIELD

Embodiments of the present disclosure relate to a packaging method and a display device.

BACKGROUND

During a display and a thin film device are manufactured, upper and lower substrates of the display and the thin film device need be packaged, because electric elements, photoelectric devices within the display and the thin film device easily react with water and oxygen in the air so that performance of the display and thin film device fails. Currently, for improving gas tightness between upper and lower substrates of the display and the thin film device, it usually uses sealant to join the two substrates, and uses thermal sintering to make the sealant respectively join upper and lower substrates, so as to avoid the environment moisture and oxygen entering the devices, thereby prolonging the service life of the display or the thin film device.

A conventional packaging process mainly comprises the following steps: filling sealant into sealing region of the device substrate and the packaging substrate; closely pressing the packaging substrate and the device substrate by using vacuum ultraviolet (UV) heat pressing process; then fusing the sealant in the sealing region by moving laser beam under the condition of shielding gas such as nitrogen; cooling the fused sealant and forming a closed packaging space by the cooled sealant and the packaging substrate and the device substrate.

The above packaging process mainly has the following defects: firstly, the whole packaging procedure needs the process of coating ultraviolet curing adhesive and the like, therefore, it needs a number of processes, which are not beneficial to improve efficiency of mass production; secondly, in the procedure of laser beam radiation, since the sealant would produce stress after being heated, after the sealant is fused and cooled to form packaging glass with the packaging substrate and the device substrate, the remained stress within the packaging glass would break or peeling, resulting in the failure of the sealing of the display or the thin film device.

SUMMARY

The embodiments of the present disclosure relate to a packaging method and a display device, which simplifies the procedures of the packaging method and reduces occurrence of breaking or peeling of the packaging glass caused by the stress within the sealant when the laser beam radiates the sealant.

Embodiments of the present disclosure use the following technical solutions.

According to an aspect of the present disclosure, a packaging method is provided. The packaging method comprises steps of: providing a first and a second substrates having a packaging region, wherein a region surrounding by the packaging region of the second substrate is provided with a device to be packaged; forming a pattern layer of sealant on the packaging region of the first substrate; bonding the first substrate having the sealant with the second substrate having a device to be packaged so that the packaging region of the first substrate is aligned with the packaging region of the second substrate; and sintering the sealant and applying a uniform compression force to the packaging region when using a laser to radiate the packaging region.

In an example, the compression force is an airflow compression force.

In an example, the step of sintering the sealant and applying the uniformly a compression force to the packaging region when using the laser to radiate the packaging region comprises steps of sintering the sealant by controlling the laser beam to move along the packaging region outside of the first substrate or the second substrate, and controlling the airflow to simultaneously move with the laser beam.

In an example, the step of sintering the sealant and applying the uniformly a compression force to the packaging region when using the laser to radiate the packaging region comprises steps of sintering the sealant by controlling the laser beam to move along the packaging region outside of the first substrate or the second substrate, and applying the airflow to the whole first substrate or second substrate when using the laser beam to radiate the packaging region.

In an example, the packaging region is a closed rectangular ring.

The rectangular ring has a width less than a spot diameter of the laser beam.

In an example, the second substrate comprises an OLED luminescent device provided thereon.

In an example, the packaging method further comprises: after forming the pattern layer of the sealant on the packaging region of the first substrate and before bonding the first substrate and the second substrate, preheating the first substrate having the sealant so that the sealant forms inorganic glass.

In an example, the steps of bonding the first substrate with the second substrate so that the packaging region of the first substrate is aligned with the packaging region of the second substrate, and sintering the sealant and applying the uniformly a compression force to the packaging region when using the laser to radiate the packaging region are performed in an environment without water and oxygen.

In an example, the step of forming the pattern layer of the sealant on the packaging region of the first substrate comprises: cleaning the first substrate; drying the cleaned first substrate to remove moisture on surfaces of the first substrate; performing a surface treatment to the packaging region of the dried first substrate; and forming the pattern layer of the sealant on the packaging region of the first substrate by using a dispensing coating process or a silk-screen printing process.

In an example, the surface treatment is plasma surface treatment.

In an example, the first substrate and the second substrate are glass substrates.

According to another aspect of the present disclosure, a display device is provided. The display device comprises a first substrate and a second substrate, wherein the first substrate and the second substrate are packaged according to the packaging method.

The embodiments of the present disclosure provide a packaging method and a display device. The packaging method comprises: firstly, forming a pattern layer of sealant on the packaging region of the first substrate; secondly, bonding the first substrates having the sealant with the second substrate so that the packaging region of the first substrate is aligned with the packaging region of the second substrate; and sintering the sealant and applying a uniform compression force to the packaging region when using a laser to radiate the packaging region.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

In order to make objects, technical details and advantages of the embodiments of the invention apparent, the technical solutions of the embodiments of the present disclosure will be described in a clearly and fully understandable way in connection with the drawings related to embodiments of the disclosure. Apparently, the described embodiments are just a part but not all of the embodiments of the disclosure. Based on the described embodiments herein, those skilled in the art can obtain other embodiment(s), without any inventive work, which shall fall within the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
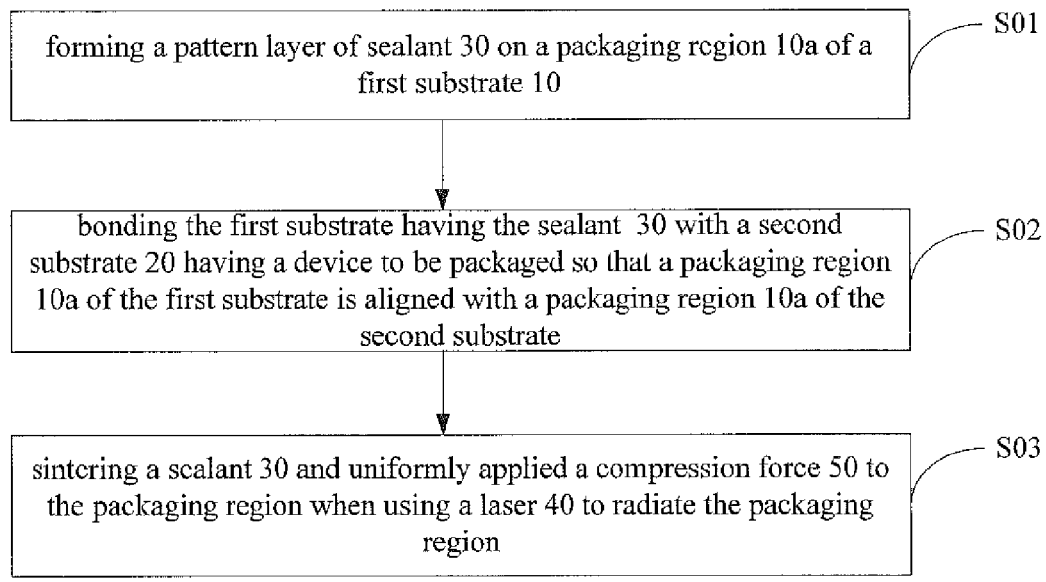
FIG. 1 is a flow diagram of a packaging method according to an embodiment of the present disclosure.
Figure 2:
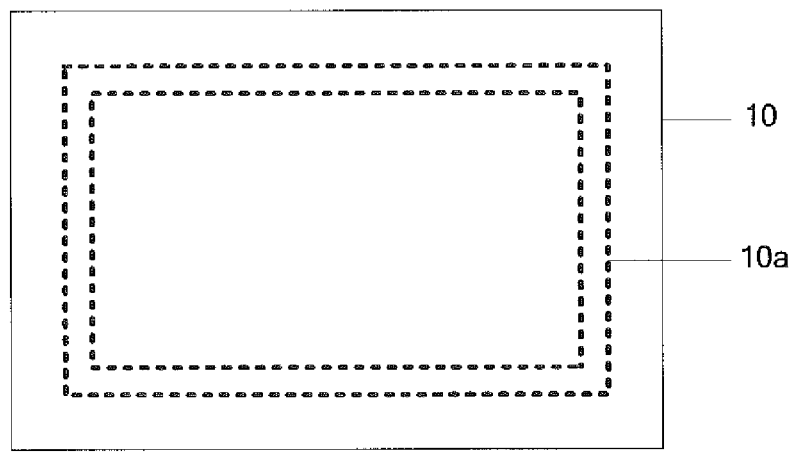
FIG. 2 is a structural top view of a packaging substrate in a packaging method according to an embodiment of the present disclosure.
Figure 3:
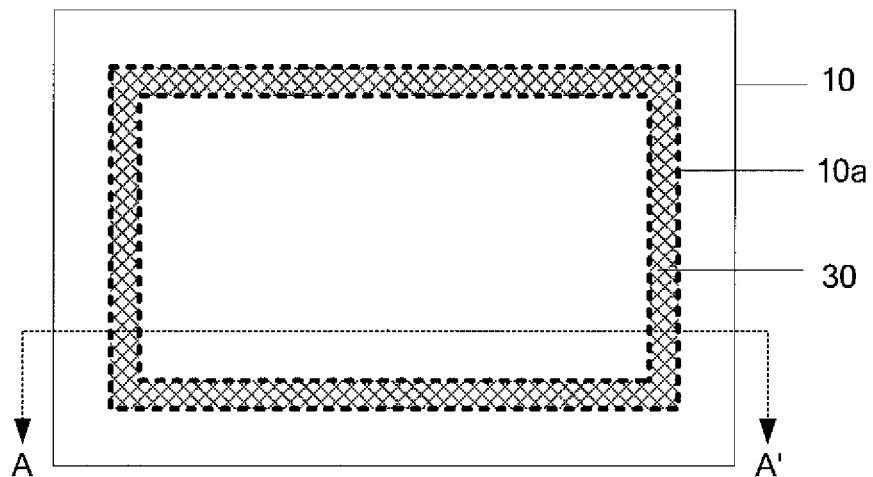
FIG. 3 is a structural top view of the substrate having a pattern layer of sealant in a packaging method according to an embodiment of the present disclosure.

Embodiment of the present disclosure provides a packaging method, as shown in FIGS. 1-3, the packaging method comprises the following steps.

S01, a pattern layer of sealant 30 is formed on a packaging region 10a of a first substrate 10 as shown in FIG. 3. Although the figure only shows a single separate packaging region of the pattern, the whole pattern can comprises a plurality of such separate packaging region.

Figure 4:
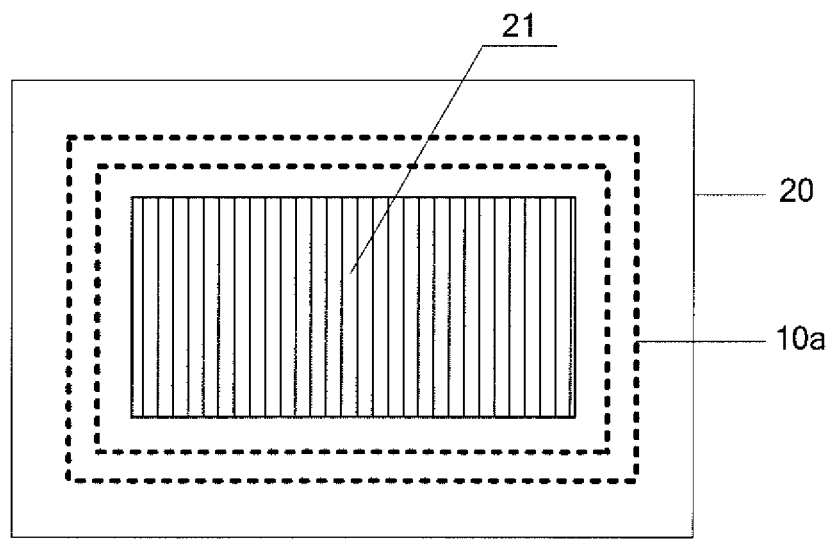
FIG. 4 is a structural top view of a device substrate in a packaging method according to an embodiment of the present disclosure.

S02, in combination of FIGS. 3 and 4, the first substrate (also referred to as a packaging substrate) having the sealant 30 is bonded with a second substrate 20 (also referred to as a device substrate since a device to be packaged is provided thereon) having a packaging region so that a packaging region 10a of the packaging substrate is aligned with a packaging region 10a of the device substrate.

For example, the first substrate 10 and the second substrate 20 can be a glass substrate, which can also be made of other materials, such as quartz, plastic or the like.

The substrate 20 is provided with one or more devices to be packaged, wherein the one or more devices to be packaged are located in one or more spaces surrounded by the packaging regions formed on the second substrate.

Figure 5:
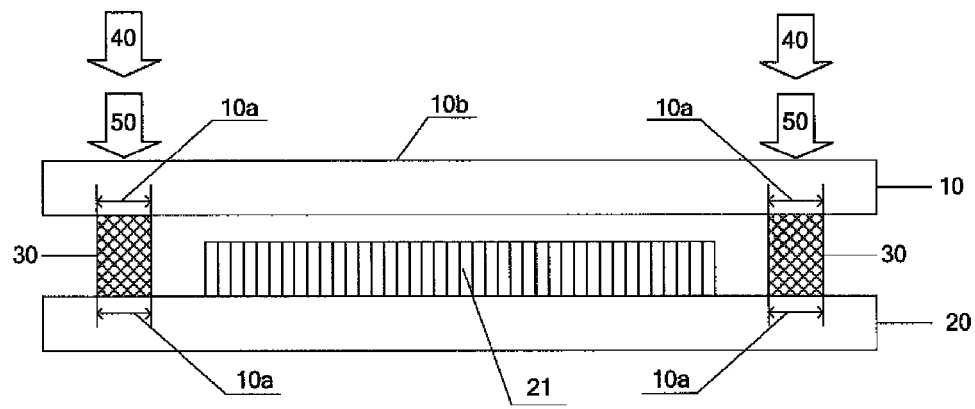
FIG. 5 is a cross sectional view of the packaging substrate bonded with the device substrate along A-A' of FIG. 3 in a packaging method according to an embodiment of the present disclosure.
Figure 6:
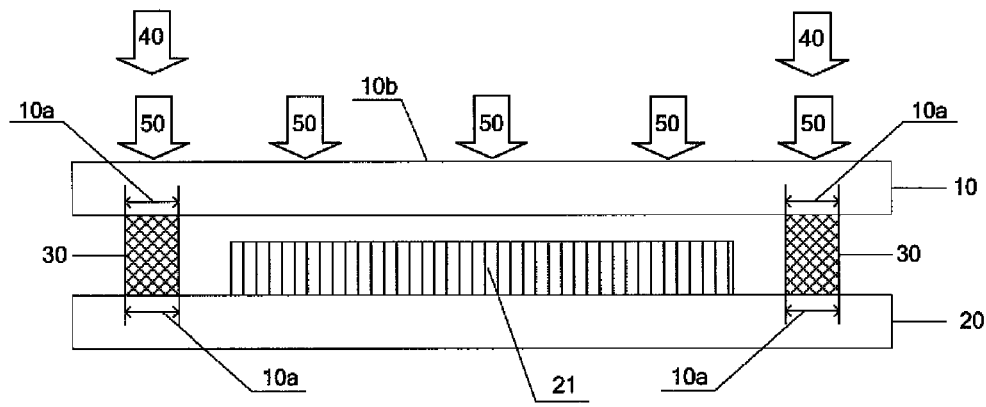
FIG. 6 is another cross sectional view of the packaging substrate bonded with the device substrate along A-A' of FIG. 3 in a packaging method according to an embodiment of the present disclosure.

S03, as shown in FIGS. 5 and 6, a sealant 30 is sintered and a compression force 50 is applied uniformly to the packaging region when a laser 40 is used to radiate the packaging region.

When the sealant 30 is sintered and cooled, a cured sealant is formed between the packaging substrate and the device substrate; since the sealant has a good isolation function, the device to be packaged in the device substrate are sealed.

It is noted that those skilled in the art would understand that the packaging region 10a of the device substrate and the device to be packaged in the device substrate are located in a same plane of the device substrate.

For alignment in above step S02, it means that the packaging region 10a of the packaging substrate vertically corresponds to the packaging region 10a of the device substrate after the packaging region 10a of the packaging substrate is accurately bonded with the packaging region 10a of the device substrate face-to-face, so that a packaging region surrounding the device to be packaged in the device substrate is formed in a space between the packaging substrate and the device substrate.

In an embodiment of the present disclosure, the packaging substrate is used to form a closed space with the device substrate so that the device to be packaged in the device substrate are isolated from surrounding environment. Therefore, those skilled in the art should understand that for the whole motherboard, the pattern of the sealant 30 is a pattern having a hollowed-out portion, wherein the device to be packaged are located in the hollowed-out portion; that is, the sealant 30 and the first substrate 10 and the second substrate 20 form a plurality of hollow spaces, the device 21 to be packaged on the second substrate 20 is located in the hollowed-spaces.

Since the sealant 30 may have a volume shrinkage in the laser sintering procedure of the above step S03, and the sealant 30 is required to allow a closed space to be formed between the packaging substrate and the device substrate, a thickness of the pattern layer of the sealant 30 is slightly thicker than that of the device to be packaged in the device substrate, and the area of the hollowed-out portion of the pattern layer of the sealant 30 should be larger than that of the pattern of the device to be packaged. The size of the space can be set according to actual situation so that the device to be packaged can be packaged without affecting other performances of the device to be packaged.

In the step S03, the packaging region is radiated by the laser 40 in the following way: the packaging region is radiated from one side of the packaging substrate, or the packaging region is radiated from one side of the device substrate.

Herein, for clearly understanding the embodiments of the present disclosure, in the packaging substrate, a surface, away from the sealant 30, of the first glass substrate 10 is referred to as a first non-packaging surface 10b; similarly, in the device substrate, a surface, away from the packaging device, of the second glass substrate 20 is referred to as a second non-packaging surface.

When the laser beam 40 and the uniform compression force 50 directly contact with the same substrate, the heat stress produced in the procedure of the laser 40 radiating the sealant 30 is reduced as far as possible while the packaging substrate is closely bonded with the device substrate. Therefore, referring to FIG. 5 or FIG. 6, in the embodiment(s) of the present disclosure, the laser beam 40 and the uniform compression force 50 contact with the first non-packaging surface 10b of the packaging substrate at the same time; that is, the laser beam 40 directly radiates the first non-packaging surface 1013 of the packaging substrate, and penetrates the first glass substrate 10 and radiates the sealant 30 located in the packaging region 10a; at the same time, the uniform compression force 50 is directly applied to the first non-packaging surface 10b.

The laser beam 40 and the uniform compression force 50 can also directly contact with the second non-packaging surface of the device substrate at the same time, which is not repeated herein.

The embodiments of the present disclosure provide a packaging method. The packaging method comprises forming a pattern layer of sealant 30 on the packaging region 10a of the first glass substrate 10; bonding the packaging substrate having the sealant with the device substrate so that the packaging region 10a of the packaging substrate is aligned with the packaging region 10a of the device substrate; and sintering the sealant 30 and applying a uniform compression force 50 to the packaging region 10a when using a laser 10 to radiate the packaging region 10a.

By using the above packaging method, on one hand, a compression force is uniformly applied to the packaging region 10a while the laser beam 40 radiates the packaging region 10a so that the packaging substrate is closely bonded with the device substrate, in such a way, it helps the sealant 30 to seal the packaging substrate and the device substrate after the sealant 30 is fused by radiation of the laser 40; and in the packaging method provided by the embodiment of the present disclosure, since the compression force is uniformly applied to the packaging region 10a while the laser beam 40 radiates the sealant of the packaging region 10a, the embodiment of the present disclosure can simplify the procedures of the packaging method compared with the prior art. On the other hand, since the compression force is uniformly applied to the packaging region 10a while the laser beam 40 radiates the sealant of the packaging region 10a, the stress produced in the procedure of the laser 40 radiating the sealant 30 is reduced, thereby it is possible to reduce the occurrence of breaking or peeling of the packaging sealant caused by the stress produced in the procedure of the laser 40 radiating the sealant 30, after the sealant 30 is sintered.

Alternatively, the step S01 can comprises a several sub-steps.

S101, the first glass substrate 10 is cleaned.

S102, the cleaned first glass substrate 10 is dried to remove the moisture on the surfaces of the first glass substrate 10.

S103, the packaging region 10a of the dried first glass substrate 10 is performed with surface treatment; and the pattern layer of the sealant 30 is formed on the packaging region 10a of the first glass substrate 10 by using a dispensing coating process or a silk-screen printing process.

For example, plasma is used to perform the surface treatment on the packaging region 10a of the dried first glass substrate 10 so that the sealant 30 can be more firmly bonded with the first glass substrate 10.

Alternatively, in the step S03, the compression force 50 can be a airflow compression force, a magnetic compression force, a mechanical compression force or the like. Since the airflow compression force is easily operated during implementing the packaging procedure, the compression force 50 used in the embodiment of the present disclosure is airflow compression force, for example. The airflow can comprise inert gas or nitrogen.

On such basis, the step S03 comprise the following two ways.

A first way: referring to FIG. 5, in the first non-packaging surface 10b of the packaging substrate, the sealant 30 is sintered by controlling the laser beam 40 to move along the packaging region 10a, and the airflow is controlled to simultaneously move with the laser beam 40.

It is also possible that in the second non-packaging surface of the device substrate, the sealant 30 is sintered by controlling the laser beam 40 to move along the packaging region 10a, and the airflow is controlled to simultaneously move with the laser beam 40.

Since the device to be packaged in the device substrate usually is a thin film device having regular pattern, alternatively, the packaging region 10a is a closed rectangular ring. Since a regular laser beam has a circular light spot and the energy of the laser 40 usually focuses on the center of the light spot, the rectangular ring has a ring width less than spot diameter of the laser beam so that the sealant 30 can evenly absorb the laser beam 40.

The spot of the laser beam 40 should be far away from the device to be packaged in a direction perpendicular to the surface of the device substrate so as to prevent the laser beam 40 radiating the device to be packaged in the device substrate, thereby to avoid affecting the performance of the device to be packaged due to heat.

Furthermore, the embodiments of the present disclosure do not limit the ways of synchronizing the airflow with the laser beam 40, for example, a device which emits the laser beam 40 and a device which produces the airflow can use a same motor, and the motor is input a particular instruction by a control device so that the device which emits the laser beam 40 and the device which produces the airflow move along the packaging region, and thereby the laser beam 40 and the airflow synchronously move along the packaging region 10a.

A second way: referring to FIG. 6, it is possible that in the first non-packaging surface 10b of the packaging substrate, the sealant 30 is sintered by controlling the laser beam 40 to move along the packaging region 10a, and the airflow is applied to the whole packaging substrate while the laser beam 40 radiates the sealant 30.

It is also possible that in the second non-packaging surface of the device substrate, the sealant 30 is sintered by controlling the laser beam 40 to move along the packaging region 10a, and the airflow is applied to the whole packaging substrate while the laser beam 40 radiates the sealant 30.

Herein, since the airflow directly contacts with the whole packaging substrate or device substrate, the amount of the airflow should be strictly controlled according to a thickness of the sealant 30 so as to avoid the compression force of the airflow being too large to result in a too small distance between the packaging substrate and the device substrate, thereby avoiding the packaging substrate squeezing the device to be packaged and affecting the performance of the device to be packaged when the laser 40 radiates the sealant 30.

On this basis, since the packaging method is often used in the field of manufacturing an organic light-emitting-diode (OLED) display, the following is described by using an OLED as the device to be packaged as an example.

Since an OLED display comprises an OLED luminescent device 21, wherein the OLED luminescent device 21 comprises an organic functional layer, a cathode and an anode, and the material of the organic functional layer easily reacts with moisture and oxygen in the surrounding environment, resulting in the failure of the performance of the OLED luminescent device 21, it requires to package the OLED luminescent device 21 in the procedure of manufacturing an OLED display so that the OLED luminescent device is strictly isolated from the surrounding environment.

When the packaging substrate is used to perform packaging, since the OLED luminescent device usually has a certain thickness, a thickness of the sealant 30 located on the packaging substrate needs to be larger than the thickness of OLED luminescent device so that a closed space is formed between the packaging substrate and the device substrate to isolate the OLED luminescent device 21 from the surrounding environment. Therefore, the laser beam 40 should irradiate the sealant 30 for a long time so that the sealant 30 absorbs enough light energy to be sintered, as a result, it is possible that the packaging substrate is poorly or unevenly bonded with the device substrate; and a long time of laser radiation may pass the heat of the laser 40 to the OLED luminescent device 21 to affect the performance of the OLED luminescent device 21. Furthermore, in the procedure of laser 40 radiating, the sealant 30 may volatilize organic substance therein after being heated, and the volatilized organic substance may likely react with the OLED luminescent device 21.

Therefore, for example, it further comprises the following step between S01 and S02: preheating the packaging substrate having the sealant 30 so that the sealant 30 forms inorganic glass.

Herein, the preheating temperature rising curve is determined based on the material of the sealant 30. For example, for a sealant 30 used to package a conventional OLED display, the packaging substrate having the sealant 30 is placed in a heating furnace, the sealant 30 is gradually heated and cooled to form an inorganic glass according to a temperature rising curve by a temperature controller connected to the heating furnace.

In this situation, in above step S03, the inorganic glass formed by preheating the sealant 30 is sintered so that the inorganic glass can form a cured packaging glass in subsequent procedure of laser 40 heating.

Furthermore, since the OLED luminescent device 21 needs to be strictly isolated from the moisture and oxygen in the atmosphere environment, the steps S02 and S03 are performed in an environment without water and oxygen.

It is noted that the embodiments of the present disclosure are not limited to package the OLED luminescent device 21, it can also package other thin film devices, for example, the packaging method provided by the embodiments of the present disclosure can be used to package a solar battery, a thin film sensor or the like.

Based on the above description, since it requires to convert the absorbed light energy of the laser 40 into heat energy to sinter the sealant 30, the sealant 30 should use a material which can strongly absorb the laser 40. Therefore, for example, the sealant 30 comprises glass powder, organic solvents and adhesives.

The organic solvents and adhesives enable the glass powder to have a certain viscosity and to be fixed on a surface of the first glass substrate 10.

A wavelength and power of the laser 40 can be determined based on optical absorption coefficient of the glass dust in the sealant 30 and the thickness of the sealant 30.

The following example is provided to describe above packaging method in detail. In this example, the OLED display device comprises a device substrate and a packaging substrate; the device substrate comprises a second glass substrate 20 and an OLED luminescent device 21 located on the second glass substrate 20. The OLED luminescent device 21 comprises an organic functional layer, a cathode and an anode, and the packaging substrate comprises a first glass substrate 10.

The packaging method comprises the following steps.

S11, the first glass substrate 10 is cleaned; the cleaned first glass substrate 10 is dried to remove the moisture on the surface of the first glass substrate 10; the packaging region 10a of the dried first glass substrate 10 is surface treating by plasma; and the pattern layer of the sealant 30 is formed on the packaging region 10a of the first glass substrate 10 by using a dispensing coating process.

S12, the packaging substrate on which the pattern of the sealant 30 is formed is heated so that the sealant 30 forms inorganic glass. The temperature rising curve is as follows.

A first temperature rising stage: the packaging substrate having the sealant 30 is placed in a heating furnace so that the packaging substrate is heated from room temperature to 150-200° C., and is kept in this temperature range for 30 minutes.

A second temperature rising stage: the packaging substrate is uniformly heated from 150-200° C. to 300-350° C. in the heating furnace, and is kept in this temperature range for 20 minutes to remove the organic solvents in the sealant 30 and organic components in the adhesives.

A third temperature rising stage: the packaging substrate is uniformly heated from 300-350° C. to 400-500° C. in the heating furnace, and is kept in this temperature range for 60 minutes to fuse the sealant 30, and the sealant 30 is slowly cooled to room temperature to form a cured inorganic glass.

S13, the packaging substrate having inorganic glass is bonded with the device substrate so that the packaging region 10a of the packaging substrate is aligned with the packaging region 10a of the device substrate.

S14, referring to FIG. 6, the infrared laser 40 is controlled to directly radiate from a first non-packaging surface 10b of the packaging substrate to the packaging region 10a so that the infrared laser beam 40 penetrates the first glass substrate 10 of the packaging substrate and sinters the inorganic glass formed on the packaging region 10a of the packaging substrate, and the infrared laser 40 is controlled to move along the packaging region 10a while the airflow compression force is uniformly applied to the first non-packaging surface 10b of the packaging substrate.

Herein, since the airflow directly contacts with the whole packaging substrate, the amount of the airflow should be strictly controlled according to a thickness of the inorganic glass formed by preheating the sealant 30 so as to avoid the compression force of the airflow being too large to result in the small distance between the packaging substrate and the device substrate, and thereby to avoid the packaging substrate squeezing OLED luminescent device 21 and affecting the performance of OLED luminescent device 21 when the infrared laser 40 radiates the inorganic glass.

A cured packaging glass can be formed between the packaging substrate and the device substrate by the above steps S11-S14. Since the glass has a good isolation function, it can seal the OLED luminescent device 21 to be packaged in the device substrate.

Based on above description, the embodiment of the present disclosure also provides a display device. The display device comprises a packaging substrate and a device substrate, wherein the packaging substrate and the device substrate are packaged according to above packaging method.

The display device further comprises the cured packaging glass formed between the packaging substrate and the device substrate by the above packaging method.

The display device can be any products or components having display function, such as an organic-electroluminescent-diode display device, an organic-electroluminescent-diode display panel, an electric paper, a plasma display device, a display, digital photo frame, a cell phone, or a tablet computer. Since a luminescent device in an OLED display need to be strictly isolated from the water and oxygen in the surrounding environment so that the impermeability of the luminescent device meets the requirement of the moisture permeability being less than $10^{-6}$ g/m$^2$/day, the oxygen permeability being less than $10^{-3}$ cm$^3$/m$^2$/day, according to one example of the present disclosure, the display device is an OLED display device, the device substrate comprises an OLED luminescent device disposed on the second glass substrate; wherein the OLED luminescent device comprises an organic functional layer, a cathode and an anode.

When the packaging method provided by embodiments of the present disclosure is applied to the OLED display device, on one hand, the procedure of packaging the OLED display device can be simplified to improve the efficiency of packaging the OLED display device; on the other hand, since using the above packaging method can avoid occurrence of breaking or peeling of the packaging glass caused by the remained stress within the sealant of the packaging substrate after sintering; and can reduce the performance failure of the OLED luminescent device caused by bad packaging, thereby reducing the rate of the unqualified OLED display device and prolonging the service life of the OLED display device.

It is noted that all Figures of the present disclosure are schematic views of the packaging substrate and the device substrate referred in the packaging methods so as to clearly illustrate the technical solution of the present disclosure; other un-shown structures can be regular structures.

By using the above packaging method, on one hand, a compression force is uniformly applied to the packaging region while the laser beam radiates the packaging region so that the packaging substrate is closely bonded with the device substrate, in such a way, it helps the sealant to seal the packaging substrate and the device substrate after the sealant is fused by radiation of the laser; and the embodiment of the present disclosure can simplify the procedures of the packaging method compared with the prior art. On the other hand, since the compression force is uniformly applied to the packaging region while the laser beam radiates the sealant of the packaging region, the stress produced in the procedure of the laser radiating the sealant is reduced, thereby it is possible to reduce the occurrence of breaking or peeling of the packaging sealant caused by the stress produced in the procedure of the laser radiating the sealant, after the sealant is sintered.

When the packaging method is applied to a display device, the procedure of packaging the display device can be simplified to improve the efficiency of packaging the display device. At the same time, since using the above packaging method can avoid occurrence of breaking or peeling of the packaging glass caused by the remained stress within the sealant of the packaging substrate after sintering; and can reduce the performance failure of the display device caused by bad packaging, thereby reducing the rate of the unqualified display device and prolonging service life of the display device.

It is understood that the described above are only illustrative embodiments and implementations of the present disclosure, and the present disclosure is not intended to limited thereto. For one of ordinary skill in the art, various modifications and improvements may be made without departing from the spirit and scope of embodiments of the present disclosure, and all of which should fall within the protection scope of the present disclosure. The scope protected by the present disclosure is defined by the appended claims.

What is claimed is:

1. A packaging method, comprising the steps of:
providing a first substrate and a second substrate, each of the first substrate and the second substrate having a packaging region, wherein a region surrounded by the packaging region of the second substrate is provided with a device to be packaged;
forming a pattern layer of sealant on the packaging region of the first substrate;
bonding the first substrate having the sealant with the second substrate having a device to be packaged so that the packaging region of the first substrate is aligned with the packaging region of the second substrate; and
sintering the sealant and applying uniformly a compression force to the packaging region when using a laser to radiate the packaging region, wherein the step of forming the pattern layer of the sealant on the packaging region of the first substrate comprises:
cleaning the first substrate;
drying the cleaned first substrate to remove moisture on surfaces of the first substrate; and
performing a surface treatment to the packaging region of the dried first substrate, and forming the pattern layer of the sealant on the packaging region of the first substrate by using a dispensing coating process or a silk-screen printing process.

2. The packaging method according to claim 1, wherein the compression force is an airflow compression force.

3. The packaging method according to claim 2, wherein the step of sintering the sealant and applying uniformly the compression force to the packaging region when using the laser to radiate the packaging region comprises a step of:
sintering the sealant by controlling the laser beam to move along the packaging region outside of the first substrate or the second substrate, and controlling the airflow to simultaneously move with the laser beam.

4. The packaging method according to claim 2, wherein the step of sintering the sealant and applying uniformly the compression force to the packaging region when using the laser to radiate the packaging region comprises:

sintering the sealant by controlling the laser beam to move along the packaging region outside of the first substrate or the second substrate, and applying the airflow to the whole first substrate or the whole second substrate when using the laser beam to radiate the packaging region.

5. The packaging method according to claim 1, wherein the packaging region is a closed rectangular ring; and the rectangular ring has a ring width less than a spot diameter of the laser beam.

6. The packaging method according to claim 1, wherein the device to be packaged is an OLED luminescent device.

7. The packaging method according to claim 6, wherein the steps of bonding the first substrate with the second substrate so that the packaging region of the first substrate is aligned with the packaging region of the second substrate, and sintering the sealant and applying uniformly the compression force to the packaging region are performed in an environment without water and oxygen.

8. The packaging method according to claim 1, wherein the surface treatment is a plasma surface treatment.

9. The packaging method according to claim 1, wherein both of the first substrate and the second substrate are glass substrates.

10. A display device, comprising a first substrate and a second substrate; wherein the first substrate and the second substrate are packaged by using the packaging method according to claim 1.

11. The packaging method according to claim 2, wherein the packaging region is a closed rectangular ring; and the rectangular ring has a ring width less than spot diameter of the laser beam.

12. The packaging method according to claim 3, wherein the packaging region is a closed rectangular ring; and the rectangular ring has a ring width less than spot diameter of the laser beam.

13. The packaging method according to claim 4, wherein the packaging region is a closed rectangular ring; and the rectangular ring has a ring width less than spot diameter of the laser beam.

14. The packaging method according to claim 2, wherein the device to be packaged is an OLED luminescent device.

15. The packaging method according to claim 3, wherein the device to be packaged is an OLED luminescent device.

16. The packaging method according to claim 4, wherein the device to be packaged is an OLED luminescent device.

17. The packaging method according to claim 2, wherein both of the first substrate and the second substrate are glass substrates.

18. The packaging method according to claim 3, wherein both of the first substrate and the second substrate are glass substrates.

19. A packaging method, comprising the steps of:
providing a first substrate and a second substrate, each of the first substrate and the second substrate having a packaging region, wherein a region surrounded by the packaging region of the second substrate is provided with a device to be packaged,
forming a pattern layer of sealant on the packaging region of the first substrate;
preheating the first substrate having the sealant by a three-stage annealing process so that the sealant forms inorganic glass;
bonding the first substrate having the sealant with the second substrate having a device to be packaged so that the packaging region of the first substrate is aligned with the packaging region of the second substrate; and
sintering the sealant and applying uniformly a compression force to the packaging region when using a laser to radiate the packaging region.

* * * * *